United States Patent
Hur et al.

(10) Patent No.: US 7,088,635 B2
(45) Date of Patent: Aug. 8, 2006

(54) BANK BASED SELF REFRESH CONTROL APPARATUS IN SEMICONDUCTOR MEMORY DEVICE AND ITS METHOD

(75) Inventors: Hwang Hur, Kyoungki-do (KR); Tae-Yun Kim, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 26 days.

(21) Appl. No.: 11/027,195

(22) Filed: Dec. 30, 2004

(65) Prior Publication Data
US 2005/0270874 A1 Dec. 8, 2005

(30) Foreign Application Priority Data
Jun. 3, 2004 (KR) .................. 10-2004-0040333

(51) Int. Cl.
*G11C 7/00* (2006.01)
(52) U.S. Cl. ............. 365/222; 365/230.03; 365/195; 365/63; 365/230.08
(58) Field of Classification Search ........ 365/230.03, 365/222, 195, 191, 72, 63, 230.08
See application file for complete search history.

(56) References Cited

U.S. PATENT DOCUMENTS

| | | | |
|---|---|---|---|
| 6,590,822 B1 * | 7/2003 | Hwang et al. | 365/222 |
| 6,650,587 B1 | 11/2003 | Derner et al. | 365/222 |
| 6,738,861 B1 | 5/2004 | Lawrence | 711/106 |
| 6,760,806 B1 | 7/2004 | Jeon | 711/106 |
| 6,819,617 B1 * | 11/2004 | Hwang et al. | 365/222 |
| 6,834,022 B1 | 12/2004 | Derner et al. | 365/222 |
| 2005/0041506 A1 * | 2/2005 | Hwang et al. | 365/222 |

FOREIGN PATENT DOCUMENTS

| | | |
|---|---|---|
| JP | 2002-334576 | 11/2002 |
| KR | 1020020068749 | 8/2002 |
| KR | 1020040040579 A | 5/2004 |

* cited by examiner

*Primary Examiner*—Andrew Q. Tran
(74) *Attorney, Agent, or Firm*—Blakely Sokoloff Taylor & Zafman

(57) ABSTRACT

A partial array self refresh (PASR) control apparatus for use in a semiconductor memory device having a plurality of banks includes: a bank deselection unit having a plurality of bank deselection signal output units for receiving a plurality of PASR code signals, wherein input terminal lines of each bank deselection signal output unit and signal lines of the plurality of PASR code signals are crossed each other and are selectively coupled each other.

10 Claims, 5 Drawing Sheets

| A2 | A1 | A0 | Refresh Banks |
|----|----|----|---------------|
| 0  | 0  | 0  | All Banks (0, 1, 2, 3) |
| 0  | 0  | 1  | 2 Banks (0, 1) |
| 0  | 1  | 0  | 1 Banks (0) |
| 0  | 1  | 1  | Reserved |
| 1  | 0  | 0  | 3 Banks (1, 2, 3) |
| 1  | 0  | 1  | 2 Banks(2, 3) |
| 1  | 1  | 0  | 1 Banks(3) |
| 1  | 1  | 1  | Reserved |

BANK BASED SELF REFRESH CONTROL APPARATUS IN SEMICONDUCTOR MEMORY DEVICE AND ITS METHOD

FIELD OF INVENTION

The present invention relates to a self refresh device; and, more particularly, to a bank-based partial array self refresh device for use in a semiconductor memory device.

DESCRIPTION OF PRIOR ART

Generally, a memory cell of a dynamic random access memory (DRAM) is formed by a transistor and a capacitor for storing a single-bit data. The single-bit data is stored in the form of electrical charge in the capacitor. However, charge quantity stored in the capacitor is reduced as time passes. Therefore, memory cells included in the DRAM must be refreshed periodically in order to hold data contents.

There are two different refresh modes, i.e., one is an auto refresh mode for performing an auto refresh operation and the other is a self refresh mode for performing a self refresh operation.

In the auto refresh mode, an external refresh command signal is inputted to the DRAM. A cell array to be refreshed is selected according to a counted internal address generated based on the external refresh command signal. Thereafter, the selected cell array is refreshed.

In the self refresh mode, the self refresh operation is performed based on not only the external refresh command signal but also an internal self refresh entry command signal.

However, in a conventional DRAM, all the memory cells are refreshed during the self refresh operation. That is, all the memory cells are selected to be refreshed according to a bank selection address for selecting a bank and a word line address for selecting a word line in the bank. Therefore, not only data-stored memory cells but also no data-stored memory cells are refreshed. It is desirable to refresh only the data-stored memory cells for reducing power consumption. However, since an additional memory device is required not to refresh the no data-stored memory cells, all the memory cells including the no data-stored memory cells are refreshed.

However, a semiconductor memory device for use in a portable electronic device such as a personal digital assistant (PDA) or a cell phone is required to reduce power consumption for reducing battery power consumption.

Therefore, a partial array self refresh (PASR) operation has been introduced for performing the self refresh operation to a data-stored memory cell array. In comparison with the above-mentioned self refresh operation, the PASR operation is performed consuming less power because the PASR operation is performed to only the data-stored memory cell array.

Meanwhile, according to the PASR operation, a bank not to be refreshed is selected by inactivating a bank active signal based on a PASR code.

In detail, a PASR operation entry command signal and the PASR code are inputted to a DRAM for performing the PASR operation, i.e., an extended mode register set 2 (EMRS2) is inputted as the PASR operation entry command signal and a first address A<0> to a third address A<2> of the EMRS2 are used as the PASR code. Hereinafter, the first to the third addresses A<0> to A<2> are referred as a PASR code A<0:2>.

FIG. 1 is a diagram showing the EMRS2 and the PASR operation according to the PASR code A<0:2>.

As shown, different numbers of banks are refreshed based on the PASR code A<0:2>.

For example, if the PASR code A<0:2> is 000, all of a first bank bank0 to a fourth bank bank3 are refreshed. If the PASR code A<0:2> is 001, the first bank bank0 and the second bank bank1 are refreshed.

However, if it is required to change the PASR code by request of a vendor, lots of revisions are required such as adding new signals lines. Therefore, it is desirable to change the PASR code minimizing the revisions.

SUMMARY OF INVENTION

It is, therefore, an object of the present invention to provide a partial array self refresh (PASR) control device capable of changing a PASR code.

In accordance with an aspect of the present invention, there is provided a partial array self refresh (PASR) control apparatus for use in a semiconductor memory device having a plurality of banks including: a bank deselection unit having a plurality of bank deselection signal output units for receiving a plurality of PASR code signals, wherein input terminal lines of each bank deselection signal output unit and signal lines of the plurality of PASR code signals are crossed each other and are selectively coupled each other.

In accordance with another aspect of the present invention, there is provided a method for controlling a PASR in a semiconductor memory device, including the steps of: a) generating a plurality of bank deselection code signals in response to a plurality of bank refresh code signals; and b) generating a bank deselection signal by performing logic operation to the plurality of bank deselection code signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a partial array self refresh (PASR) control device in accordance with the present invention will be described in detail referring to the accompanying drawings.

Figure 2:
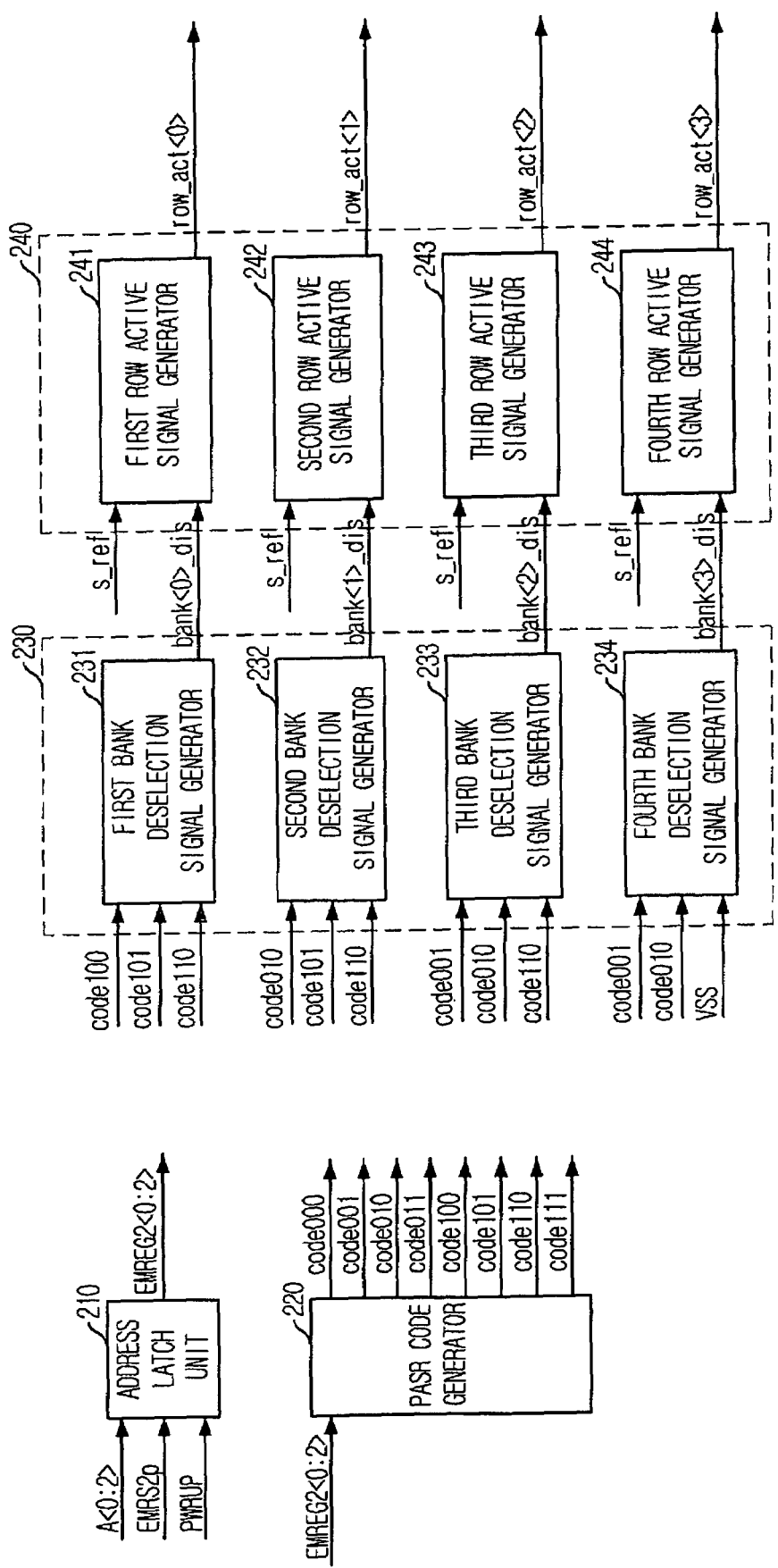
FIG. 2 is a block diagram showing a preferred embodiment of a PASR control device for use in a semiconductor memory device in accordance with the present invention.

FIG. 2 is a block diagram showing a preferred embodiment of a PASR control device for use in a semiconductor memory device in accordance with the present invention.

As shown, the PASR control device includes an address latch unit 210, a PASR code generator 220, a bank deselection unit 230 and a row active signal generation unit 240.

The address latch unit 210 latches a 3-bit address signal A<0:2> and outputs the latched 3-bit address signal A<0:2> as a latched code signal EMREG2<0:2> based on extended mode register set 2 (EMRS2) flag signal EMRS2p.

The PASR code generator 220 receives and decodes the latched code signal EMREG2<0:2> for generating eight numbers of PASR code signals, i.e., a first to an eighth PASR code signals code000 to code111.

The bank deselection unit 230 receives the first to the eighth PASR code signals code000 to code111 and generates a first to a fourth bank deselection signals bank<0>_dis to bank<3>_dis based on the first to the eighth PASR code signals code000 to code111.

The row active signal generation unit 240 receives a self refresh signal s_ref and the first to the fourth bank deselection signals bank<0>_dis to bank<3>_dis in order to generate a first to a fourth row active signals row_act<0> to row_act<3>. A first to a fourth banks bank<0> to bank<3> of the semiconductor memory device are respectively activated to be refreshed in response to the first to the fourth row active signals row_act<0> to row_act<3>. For example, if the first and the second row active signals row_act<0> and row_act<1> are activated, the first and the second banks bank<0> and bank<1> are refreshed.

Herein, the bank deselection unit 230 includes a first to a fourth bank deselection signal generators 231 to 234. The first bank deselection signal generator 231 receives the fifth to the seventh PASR code signals code100 to code110 for generating the first bank deselection signal bank<0>_dis. Similarly, each of the second and the third bank deselection signal generators 232 and 233 receives three of the first to the eighth PASR code signals code000 to code111 for respectively generating the second and the third bank deselection signals bank<1>_dis and bank<2>_dis. The fourth bank deselection signal generator 234 receives the second PASR code signal code001, the third PASR code signal code010 and a ground voltage signal VSS.

Figure 3:
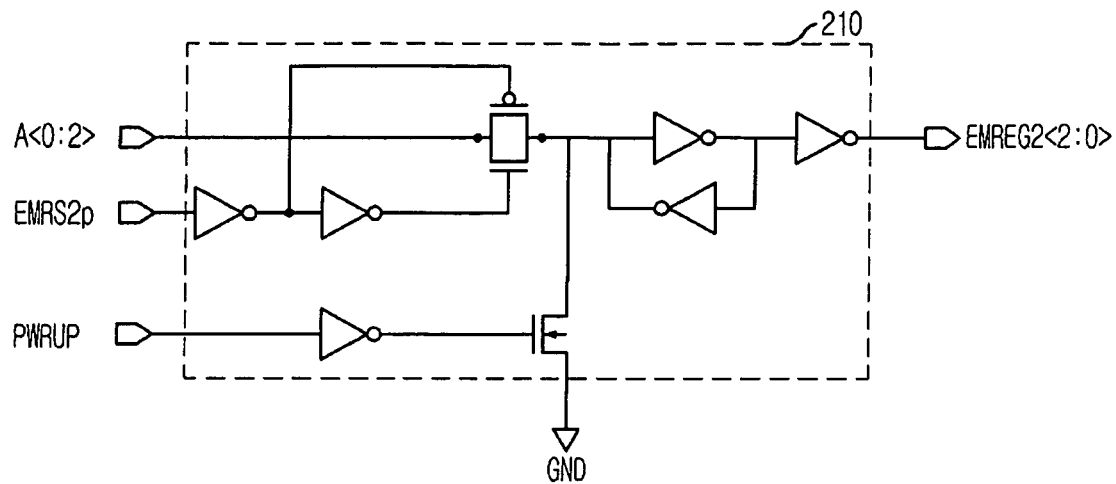
FIG. 3 is a schematic circuit diagram showing an address latch unit shown in FIG. 2.

FIG. 3 is a schematic circuit diagram showing the address latch unit 210 shown in FIG. 2.

As shown, the address latch unit 210 includes a transfer gate and a plurality of inverters.

The address latch unit 210 generates the latched code signal EMREG2<0:2> based on the 3-bit address signal A<0:2> when the address latch unit 210 is enabled by a power-up signal PWRUP and the EMRS2 flag signal EMRS2p is activated. Unless the EMRS2 flag signal EMRS2p is reset, logic states of the latched code signal EMREG2<0:2> are not changed. Meanwhile, in case of not using the EMRS2, logic states of the latched code signals EMREG2<0:2> are in a logic low level in response to the power up signal PWRUP. That is, the semiconductor memory device becomes in a PASR mode for performing a PASR operation according to the 3-bit address signal A<0:2> when the EMRS2 is set-up. The 3-bit address signal A<0:2> is updated if the EMRS2 is reset. For terminating the PASR mode, the 3-bit address signal A<0:2> should be set so as to refresh all the banks of the semiconductor memory device.

Figure 4:
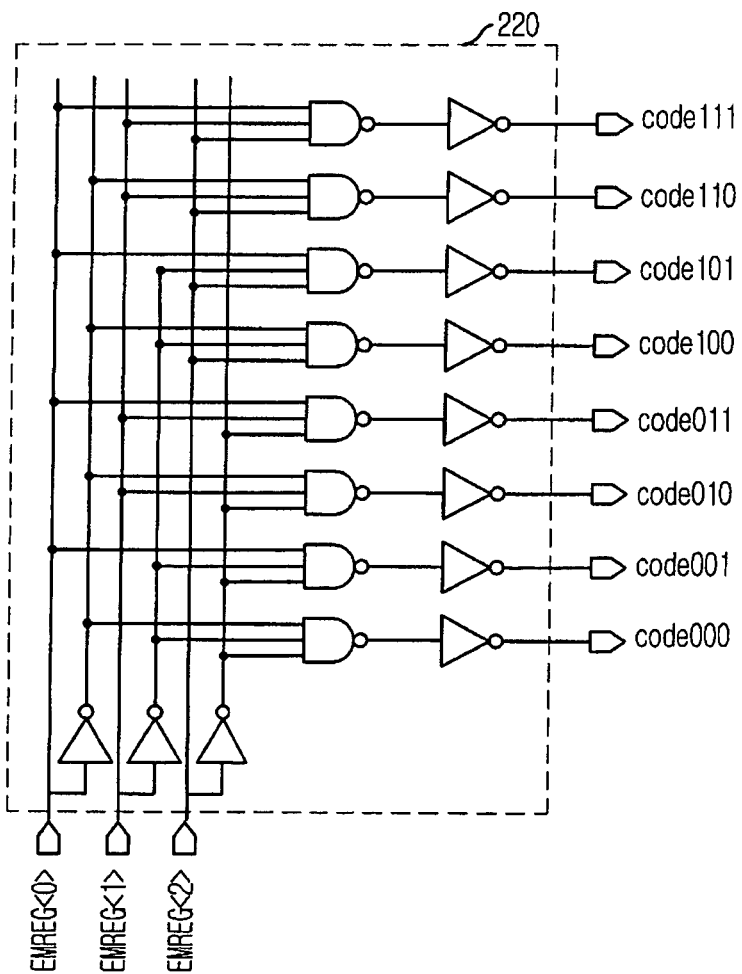
FIG. 4 is a schematic circuit diagram showing a PASR code generator shown in FIG. 2.

FIG. 4 is a schematic circuit diagram showing the PASR code generator 220 shown in FIG. 2.

As shown, the PASR code generator 220 includes a plurality of NAND gates and inverters. As above mentioned, the PASR code generator 220 receives the latched code signal EMREG2<0:2> for generating the first to the eighth PASR code signals code000 to code111.

Figure 5:
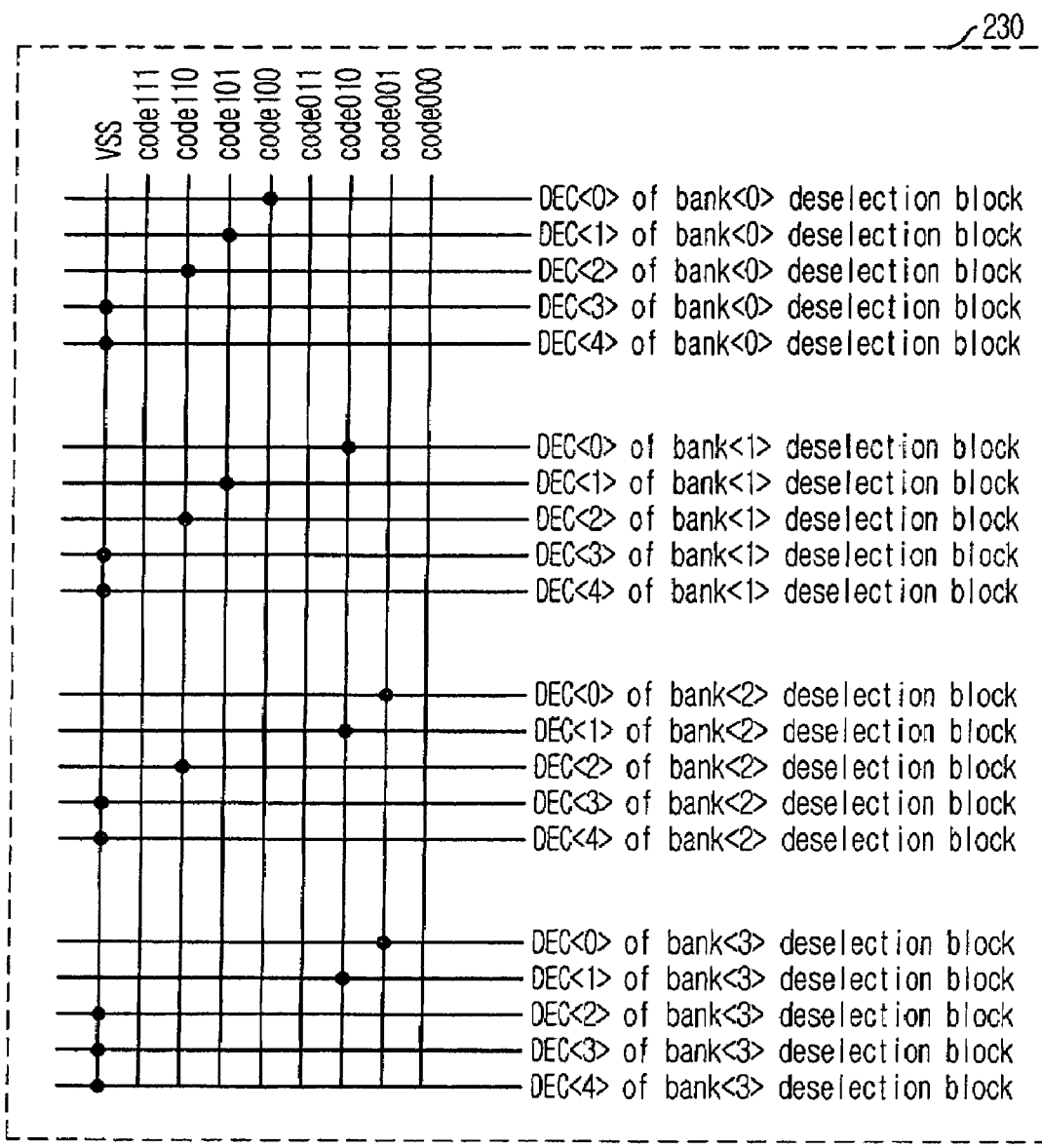
FIG. 5 is a schematic circuit diagram showing a bank deselection unit shown in FIG. 2.
Figure 5:
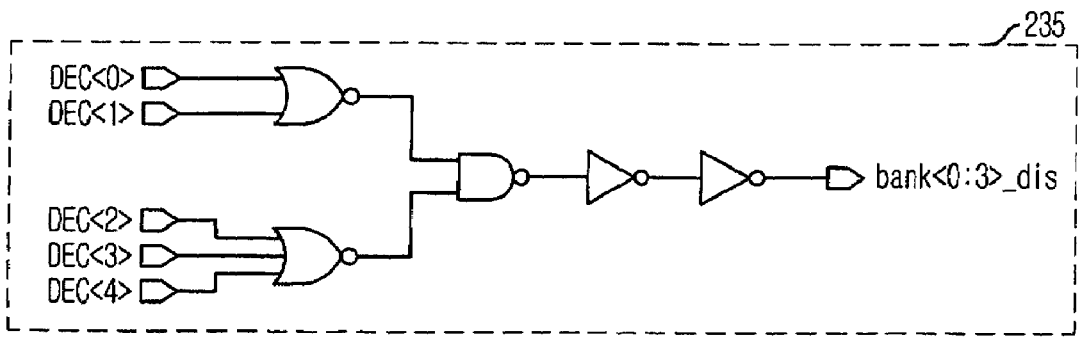

FIG. 5 is a schematic circuit diagram showing the bank deselection unit 230 shown in FIG. 2.

As shown, each of the first to the fourth deselection signal generators 231 to 234 includes a bank deselection signal output unit 235.

Signal lines of the first to the eighth PASR code signals code000 to code111 and input terminal lines of the bank deselection signal output unit 235 are laid out so that the signal lines of the first to the eighth PASR code signals code000 to code111 and the input terminal lines of the bank deselction signal output unit 235 can be crossed.

Therefore, the first to the eighth PASR code signals code000 to code111 are selected by selectively connecting the signal lines of the first to the eighth PASR code signals code000 to code111 with the input terminal lines of the bank deselection signal output unit 235. The connection between the signal lines of the first to the eighth PASR code signals and the input terminal lines of the bank deselection signal output unit 235 is performed by a metal contact or a metal option.

Figure 1:
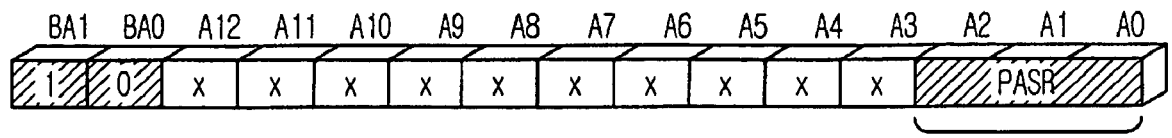
FIG. 1 is a diagram showing an EMRS2 and a PASR operation according to a PASR code.

The signal lines of the first to the eighth PASR code signals code000 to code111 and the input terminal lines of the bank deselection signal output unit 235 of the preferred embodiment are connected each other so as to satisfy the PASR operation shown in FIG. 1.

In accordance with the present invention, if a bank deselection signal is in a logic high level, a corresponding bank is not refreshed. For example, if the first bank deselection signal bank<0>_dis is in a logic high level, the first bank bank<0> is not refreshed.

Meanwhile, each of the first to the fourth bank deselection signal generators 231 to 234 receives all PASR code signals except PASR code signals which serve to refresh a corresponding bank. For example, the first bank deselection signal generator 231 receives the fifth to the seventh PASR code signals code100 to code110 which are not for refreshing the first bank bank<0>. That is, the fifth PASR code signal 100 is for refreshing the second to the fourth banks bank<1> to bank<3>; the sixth PASR code signal code101 is for refreshing the third and the fourth banks bank<2> and bank<3>; the seventh PASR code signal code110 is for refreshing the fourth bank bank<3> as shown in FIG. 1. None of the fifth to the seventh PASR code signals is for refreshing the first bank bank<0>.

However, a vendor may request a change of the PASR code. For example, although the third PASR code signal code010 is set to refresh the first bank bank<0> as shown in FIG. 1, the vendor may want the third PASR code signal code010 to be set for refreshing the second bank bank<1>.

Figure 6:
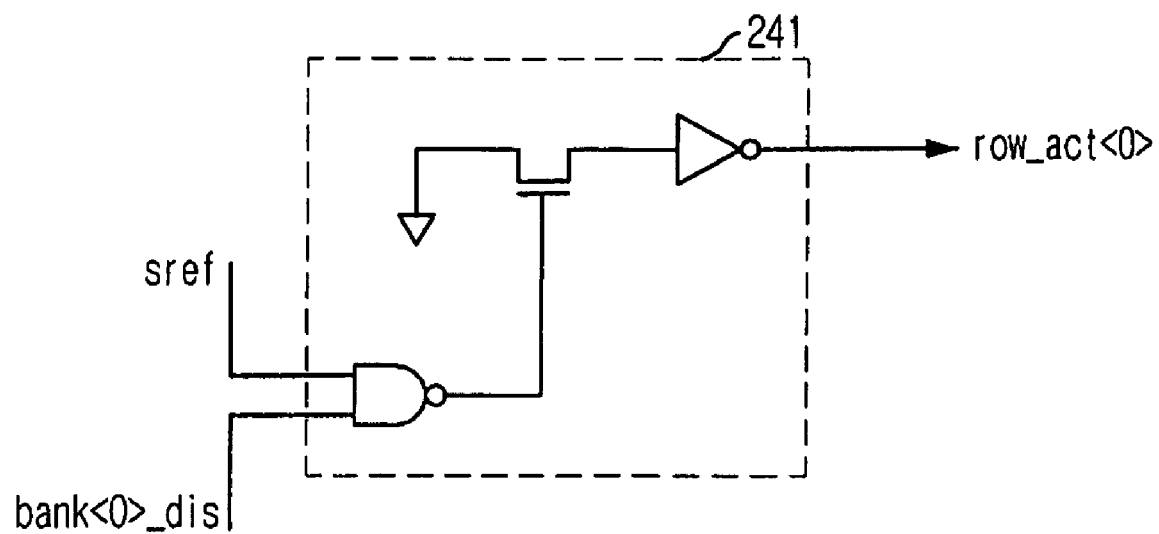
FIG. 6 is a schematic circuit diagram showing a first row active signal generator shown in FIG. 2.

FIG. 6 is a schematic circuit diagram showing the first row active signal generator 241 shown in FIG. 2.

As shown, the first row active signal generator 241 includes a NAND gate, an inverter and an n-channel metal oxide semiconductor (NMOS) transistor. Each structure of the second to the fourth row active signal generators 242 to 244 is the same as that of the first row active signal generator 241.

As above-mentioned, the first to the fourth row active signals row_act<0> to row_act<3> are for respectively activating the first to the fourth banks bank<0> to bank<3> and are generated by the first to the fourth row active signal generators 241 to 244.

The NAND gate receives the self refresh signal s_ref and the first bank deselection signal bank<0>_dis to perform a NAND operation to the self refresh signal s_ref and the first bank deselection signal bank<0>_dis.

The NMOS transistor is connected between the ground voltage VSS and the inverter. A gate of the NMOS transistor is connected to an output of the NAND gate.

The self refresh signal s_ref is activated as a logic high level during the self refresh mode. Therefore, if the self refresh signal s_ref is inactivated as a logic low level, the first bank deselection signal bank<0>_dis is ignored because the output signal of the NAND gate is always in a same logic level regardless of a logic level of the first bank deselection signal bank<0>_dis. Therefore, the first to the fourth row active signals row_act<0> to row_act<3> are in a logic high level when the semiconductor memory device is not in the self refresh mode but in an auto refresh mode. As a result, all the banks of the semiconductor memory device are refreshed when the semiconductor memory device is in the auto refresh mode.

Therefore, it is possible to change the PASR code by using the PASR control device minimizing revisions without adding additional signal lines.

The present application contains subject matter related to Korean patent application No. 2004-40333, filed in the Korean Patent Office on Jun. 3, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A partial array self refresh (PASR) control apparatus for use in a semiconductor memory device having a plurality of banks, comprising:
a bank deselection unit having a plurality of bank deselection signal output units for receiving a plurality of PASR code signals, wherein input terminal lines of each bank deselection signal output unit and signal lines of the plurality of PASR code signals cross each other and are selectively coupled to each other.

2. The PASR control apparatus as recited in claim 1, wherein the selective coupling operations between the input terminal lines of each bank deselection signal output unit and the signal lines of the plurality of PASR code signals is performed by a metal contact or a metal option to thereby selectively receive the plurality of PASR codes signals and generate a plurality of bank deselection signals.

3. The PASR control apparatus as recited in claim 2, wherein each bank deselection signal output unit includes:
a first NOR gate whose input terminals are connected to a first and a second input terminal lines;
a second NOR gate whose input terminals are connected to a third to a fifth input terminal lines;
a NAND gate for receiving each output of the first NOR gate and the second NOR gate; and
an even numbers of inverters for receiving an output of the NAND gate to output one of the plurality of bank deselection signals.

4. The PASR control apparatus as recited in claim 3, further comprising:
a row active signal generation unit including a plurality of row active signal generators each for receiving one of the plurality of bank deselection signals and a self refresh signal to thereby generate a row active signal.

5. The PASR control apparatus as recited in claim 4, wherein each row active signal generator includes:
a second NAND gate for receiving the self refresh signal and one of the plurality of bank deselection signals;
a MOS transistor whose gate is coupled to an output of the second NAND gate; and
a first inverter coupled to one end of the MOS transistor to generate the row active signal.

6. The PASR control apparatus as recited in claim 5, further comprising:
a PASR code generator for generating the plurality of PASR code signals according to an extended mode register set (EMRS).

7. The PASR control apparatus as recited in claim 6, wherein the PASR code generator includes:
a plurality of PASR code signal output units each of which selectively receives a first to a third codes of the EMRS and inverted signals of the first to the third codes to generate one of the plurality of PASR code signals.

8. The PASR control apparatus as recited in claim 7, wherein each PASR code signal output unit includes a third NAND gate and a second inverter connected in series.

9. A method for controlling a partial array self refresh (PASR) in a semiconductor memory device, comprising the steps of:
a) generating a plurality of bank deselection code signals in response to a plurality of bank refresh code signals; and
b) generating a bank deselection signal by performing logic operation to the plurality of bank deselection code signals.

10. The method as recited in claim 9, further comprising the steps of:
c) generating a latch signal by latching an external command signal;
d) generating the plurality of bank refresh code signals in response to the latch signal; and
e) transferring the bank deselection signal at a self refresh mode or blocking the bank deselection signal at an auto refresh mode.

* * * * *